(12) United States Patent
Soude et al.

(10) Patent No.: US 7,564,385 B2
(45) Date of Patent: Jul. 21, 2009

(54) CURRENT COMPENSATION FOR DIGITAL-TO-ANALOG CONVERTER

(75) Inventors: Thierry Soude, Marseilles (FR); Michel Cuenca, Septemes-les-Vallons (FR); Didier Davino, Aix-en-Provence (FR); Daniel Payrard, St. Maximin (FR); Frederic Demolli, Septemes-les-Vallons (FR)

(73) Assignee: ATMEL Corporation, San Jose, CA (US)

( * ) Notice: Subject to any disclaimer, the term of this patent is extended or adjusted under 35 U.S.C. 154(b) by 0 days.

(21) Appl. No.: 11/959,379

(22) Filed: Dec. 18, 2007

(65) Prior Publication Data

US 2009/0153380 A1 Jun. 18, 2009

(51) Int. Cl.
*H03M 1/06* (2006.01)

(52) U.S. Cl. .................. 341/118; 370/479; 717/141; 375/259

(58) Field of Classification Search ......... 341/115–155; 370/479; 717/141, 151; 375/259
See application file for complete search history.

(56) References Cited

U.S. PATENT DOCUMENTS

| | | | |
|---|---|---|---|
| 4,222,107 A | 9/1980 | Mrozowski et al. | |
| 5,602,925 A | 2/1997 | Killion | |
| 5,612,696 A | 3/1997 | Kim | |
| 5,969,658 A | 10/1999 | Naylor | |
| 6,037,889 A | 3/2000 | Knee | |
| 6,252,534 B1 | 6/2001 | Timko | |
| 6,331,830 B1 | 12/2001 | Song et al. | |
| 6,340,939 B1 | 1/2002 | Dedic | |
| 6,501,401 B2 * | 12/2002 | Van Den Boom et al. | ... 341/118 |
| 6,707,404 B1 | 3/2004 | Yilmaz | |
| 6,937,178 B1 * | 8/2005 | Rempfer et al. | ............. 341/154 |
| 7,088,274 B2 * | 8/2006 | Shill | ........................... 341/144 |
| 7,414,557 B2 * | 8/2008 | Andersson et al. | .......... 341/143 |
| 7,414,561 B1 * | 8/2008 | Brubaker | ..................... 341/145 |

FOREIGN PATENT DOCUMENTS

WO 2006/103673 5/2006

OTHER PUBLICATIONS

International Search Report in corresponding International Application No. PCT/US08/87026, dated Jan. 12, 2009, 8 pages.

* cited by examiner

*Primary Examiner*—Lam T Mai
(74) *Attorney, Agent, or Firm*—Fish & Richardson P.C.

(57) ABSTRACT

A current compensation circuit and an optimized current compensation circuit are disclosed for a Parallel Resistors Architecture (PRA) digital-to-analog converter (DAC). The circuits are used to balance code dependent current consumption of the PRA-DAC.

21 Claims, 4 Drawing Sheets

United States Patent US 7,564,385 B2

CURRENT COMPENSATION FOR DIGITAL-TO-ANALOG CONVERTER

TECHNICAL FIELD

The subject matter of this patent application is generally related to digital-to-analog converters.

BACKGROUND

A digital-to-analog converter (DAC) is a device for converting a digital code to an analog signal. For example, a DAC can convert an 8-bit digital signal into an output voltage or current having an amplitude representing the digital code. Two common examples of DACs are the "R-string" DAC and the "R-2R ladder" DAC. Another example is the Parallel Resistors Architecture (PRA) digital-to-analog converter (DAC). Advantages of the PRA-DAC over the "R-string" DAC and the "R-2R ladder" DAC include that the PRA-DAC has a constant output impedance and inherent monotonicity compared to "R-2R ladder" DACs.

PRA-DACs suffer, however, from code dependent current consumption. Code dependent current consumption can severely worsen the DACs linearity, and more particularly its integral non-linearity (INL) due to unavoidable parasitic access resistance of the DACs references. Thus use of PRA-DACs is often limited to low resolution applications.

SUMMARY

A current compensation circuit and an optimized current compensation circuit are disclosed for a Parallel Resistors Architecture (PRA) digital-to-analog converter (DAC). The circuits are used to balance code dependent current consumption of the PRA-DAC.

An advantage of the current compensation circuit and the optimized current compensation circuit is that they allow the use of the PRA-DAC without the need of a costly calibration process, or dramatically increased area due to oversizing of resistors. Furthermore, the optimized current compensation circuit allows the use of the PRA-DAC without the use of a weighted resistors compensation network.

An additional advantage of the current compensation circuit and the optimized compensation circuit is that they improve the linearity of the PRA-DAC because the voltage drop across the parasitic access resistance is substantially independent of the digital code. Furthermore, because the current sourced from the DAC is substantially independent of the digital code, load regulation of a buffer used to supply the DACs references does not need to be optimized.

Another advantage of the optimized current compensation circuit is that it allows the use of a single resistor matched to the PRA-DAC that is sufficient to obtain a well matched compensation current.

DESCRIPTION OF DRAWINGS

Like reference symbols in the various drawings indicate like elements.

DETAILED DESCRIPTION

DAC with PRA

Overview

Figure 1:
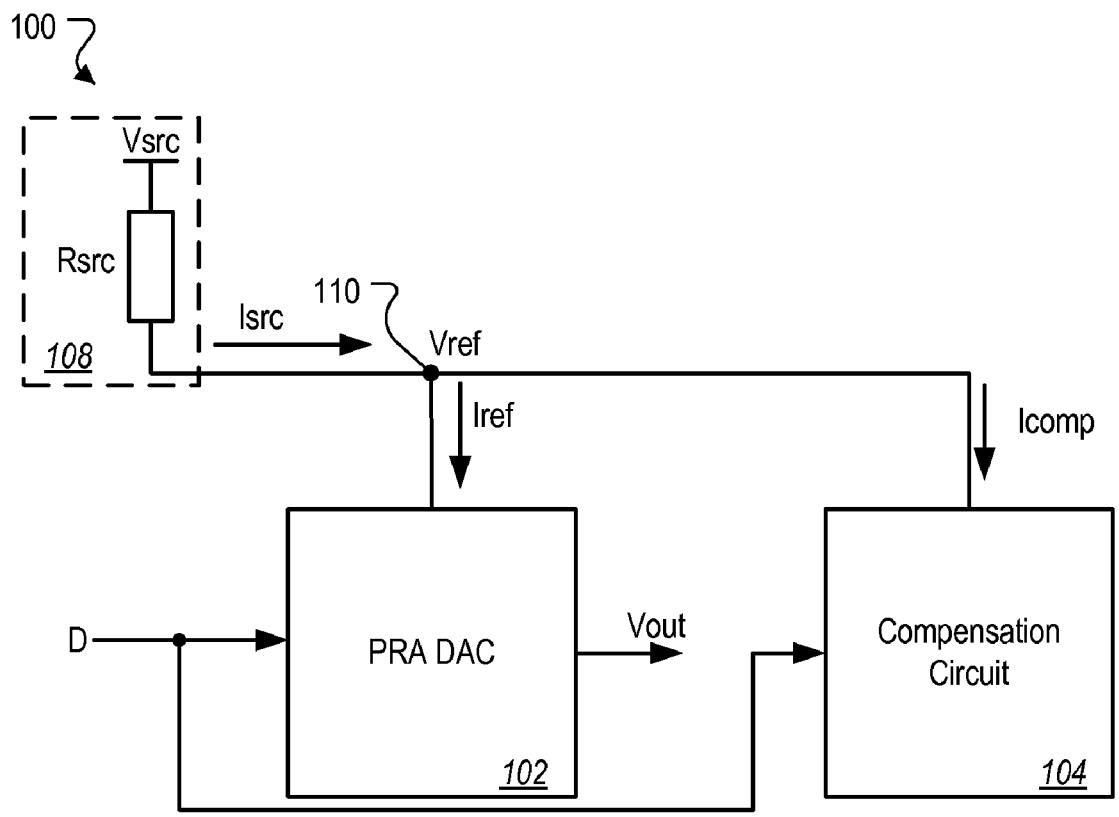
FIG. 1 is a block diagram illustrating an example system that includes a digital-to-analog converter using a parallel resistors architecture.

FIG. 1 is a block diagram illustrating an example system 100 that includes a digital-to-analog converter (DAC) 102 using a parallel resistors architecture (PRA). An example parallel resistors architecture (PRA) of the DAC 102 is described with reference to FIG. 2. Using the DAC 102, the system 100 can convert a digital input D (e.g., a n-bit binary number) into a voltage output, Vout, that is substantially linearly related to the digital input D.

In some implementations, the DAC 102 is coupled to a compensation circuit 104 via a node 110 having a reference voltage level, Vref. The DAC 102 and the compensation circuit 104 can receive the reference voltage Vref from the node 110. The DAC 102 and the compensation circuit 104 receive currents Iref and Icomp, respectively. The system 100 includes a current source 108 to supply the currents Iref and Icomp. The current source 108 includes a voltage supply node, Vsrc, and a parasitic access resistance, Rsrc, of the voltage supply node, Vsrc. The current source 108 generates a source current, Isrc, based on Vsrc and Rsrc. In some implementations, the voltage supply node, Vsrc, supplies a substantially constant voltage to the system 100 during operation. At the node 110, Isrc divides into Iref and Icomp to supply the DAC 102 and the compensation circuit 104, respectively.

In an example operation, a current consumption of the DAC 102 (Iref) varies based on the digital input D. For example, the DAC 102 can receive $Iref_{D1}$ for a digital input D1 and $Iref_{D2}$ for a digital input D2, in which $Iref_{D2} > Iref_{D1}$. The voltage drop across the parasitic resistance Rsrc due to Iref varies for digital input D1 and D2 because $Iref_{D2}$ and $Iref_{D1}$ are substantially different.

To balance the voltage drop across Rsrc, in some implementations, a current consumption of the compensation circuit 104 (Icomp) also varies based on the digital input D. Using the above example, the current consumption of the compensation circuit 104 may be $Icomp_{D1}$ and $Icomp_{D2}$ for the digital inputs D1 and D2, respectively. In one implementation, the compensation circuit 104 can generate the compensation currents $Icomp_{D1}$ and $Icomp_{D2}$ so that:

$$Isrc_{D1} = Iref_{D1} + Icomp_{D1} \approx Iref_{D2} + Icomp_{D2} = Isrc_{D2}.$$

Using the compensation circuit 104, the system 100 can have a substantially code-independent current consumption Isrc. Accordingly, the voltage-drop across the parasitic access resistance Rsrc may be code-independent. In some implementations, the system 100 is configured to maintain Vref to be substantially constant for various digital inputs D. The linearity of the DAC 102 can be improved because of the constant reference Vref at the node 110. Moreover, because Isrc is code-independent, the need for optimizing a load regulation of a buffer for supplying the reference voltage, Vref, is reduced.

Example DAC with PRA

Figure 2:
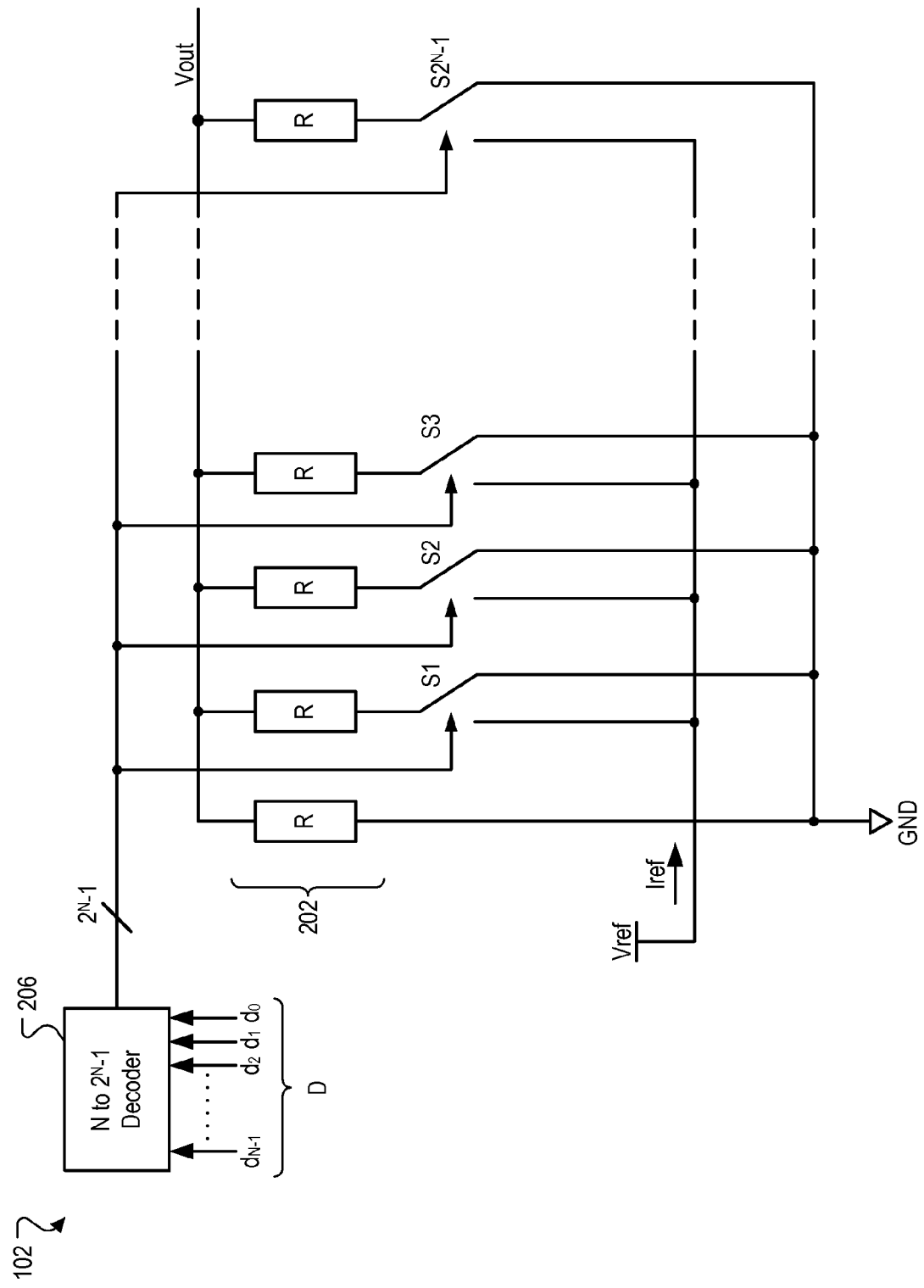
FIG. 2 is a schematic diagram illustrating an example parallel resistors architecture digital-to-analog converter circuit.

FIG. 2 is a schematic diagram illustrating an example of the DAC 102 of FIG. 1. In this example, the DAC 102 is an n-bit DAC that receives a digital input D having n bits (shown in FIG. 2 as $d_0, d_1, \ldots, d_{N-1}$). Based on the received digital input D, the DAC 102 generates an analog voltage output, Vout. In one example, the voltage output, Vout, may increase monotonically with D. For example, if $D_1 > D_2$, $Vout_{D1} > Vout_{D2}$.

The DAC 102 includes $2^N$ parallel resistors 202. In this example, each of the resistors 202 has substantially the same resistance R. One of the parallel resistors 202 is connected to ground GND. $2^N-1$ of the parallel resistors 202 are coupled to switches S1, S2, ..., S$2^N-1$. The switches S1 to S$2^N-1$ can control the $2^N-1$ parallel resistors 202 to be connected either to the reference voltage Vref or to a ground node GND.

The switches S1 to S$2^N-1$ connect the parallel resistors 202 based on a control word generated by a decoder 206. For example, the switches S1 to S$2^N-1$ can be configured so that the switch connects the connected resistor to Vref if a control signal representing logic "1" is received, and the switch connects the connected resistor to GND if a control signal representing logic 0 is received. Other reference levels can also be used. A switch can be a transistor that is biased to behave like a switch.

The decoder 206 generates a $2^N-1$ bits control word based on the received digital input D. In one implementation, each control bit in the control word corresponds to one of the switches S1 to S$2^N-1$. Based on the corresponding control bit, the switches S1 to S$2^N-1$ can connect the coupled resistors 202 to Vref or GND. In one implementation, the control word can be a decoded representation of the digital input D. For a digital input D (e.g., D is an integer between 0 and $2^N-1$), D of the $2^N-1$ control bits may be at logic 1 and $2^N-D$ of the control bits may be at logic 0. In some implementations, because the decoder 206 is configured to generate D of the $2^N-1$ control signals at logic 1 for the digital input D, D of the resistors 202 are connected to Vref and $2^N-D$ resistors are connected to the ground GND if the DAC 102 receives a digital input D.

Accordingly, the DAC 102 can generate Vout based on a voltage division between the parallel resistors connected to Vref and the parallel resistors connected to GND. In some implementations, the equivalent resistance between the reference voltage Vref to the analog output voltage, Vout, is approximately $$\frac{R}{D},$$

and the equivalent resistance between the analog output voltage, Vout, and the ground GND is approximately $$\frac{R}{2^N-D}.$$

For example, the DAC 102 generates Vout based on the digital input D according to the following equation:

$$Vout = D \cdot \left(\frac{Vref}{2^N}\right).$$

The DAC 102 can generate an analog output voltage, Vout, that is substantially monotonic to the digital input D. For example, as the digital input D is incremented by one (e.g., increment from D to D+1), an additional resistor is connected to the voltage reference Vref. Thus, the output voltage Vout based on D (Vout(D)) is smaller than the output voltage, Vout, based on D+1 (V(D+1)). In some implementations, the monotonic property of the DAC 102 is substantially independent of the quality of the matching of the resistors 202. For example, if the parallel resistors 202 are poorly matched, resulting in highly varied resistance across the resistors 202, the monotonic property of the DAC 102 can still be substantially preserved because more resistance is still connected to Vref.

As shown, the DAC 102 draws Iref from the voltage reference Vref. In this example, Iref flows first from Vref to the output node Vout through D parallel resistors, and then from Vout to GND through $2^N-D$ parallel resistors. Depending on the digital input D, the current consumption of the DAC 102 is given by:

$$Iref(D) = \frac{D}{R} \cdot (Vref - Vout), \text{ and } Iref(D) = \frac{2^N - D}{R} \cdot Vout.$$

From the above equations, an expression of the current consumption Iref of the DAC 102 is:

$$Iref(D) = \frac{Vref}{\frac{R}{D} + \frac{R}{2^N - D}}.$$

By rearranging the above equation, the current consumption can be expressed as:

$$Iref(D) = D \cdot (2^N - D) \cdot \frac{Vref}{2^N \cdot R}, \text{ or } Iref(D) = D \cdot (2^N - D) \cdot \frac{LSB}{R},$$

where $$LSB = \frac{Vref}{2^N}.$$

Note that the current consumption Iref(D) is a second order polynomial depending on the input digital word D. Iref is at minimum at D=0. The minimum value of Iref is:

$$I_{min} = Iref(D=0) = 0.$$

At mid-scale ($2^N-1$), Iref rises to the maximum. The maximum value of Iref is:

$$I_{max} = Iref(D = 2^{N-1}) = 2^{N-2} \cdot \frac{Vref}{R} = 2^{2N-2} \cdot \frac{LSB}{R}.$$

After mid-scale, Iref symmetrically decreases to:

$$Iref(D = 2^N - 1) = \frac{2^N - 1}{2^N} \cdot \frac{Vref}{R}.$$

The current consumption of the DAC 102 is code dependent. In some examples, the code dependency of Iref can degrade the linearity of the DAC 102. To maintain the linearity of the DAC 102, the compensation circuit 104 can generate another code-dependent current Icomp(D) that substantially mitigates code-dependent variations of Iref(D). By balancing variations of the current consumption Iref, a code independent current consumption Isrc of the system 100 can be maintained.

In one implementation, Isrc is substantially maintained at the maximum current consumption of Iref(D) using the compensation circuit 104. As described above, $I_{max}$=Iref(D=$2^{N-1}$). By substituting Isrc=$I_{max}$, the total current consumption can be expressed as:

$$Isrc = 2^{N-2} \cdot \frac{Vref}{R} = 2^{2N-2} \cdot \frac{Vref}{R}, \text{ or } Isrc = 2^{2N-2} \cdot I_{LSB},$$

where $$I_{LSB} = \frac{Vref}{2^N \cdot R} = \frac{LSB}{R}.$$

Since Iref(D) is a second order polynomial with maximum at the mid-scale, Iref is symmetrical with respect to the mid-scale. Referring to FIG. 1, the relationship between Iref, Icomp, and Isrc is:

$$Icomp(D)=Isrc-Iref(D).$$

By substituting equations for Iref(D) and Isrc, the following equation is obtained:

$$Icomp(D)=[2^{2N-2}-D \cdot (2^N-D)] \cdot I_{LSB}.$$

Let k be the distance from a given input digital word D to mid-scale, and $$D==2^{N-1} \mp k \text{ with } k \in [0, 2^{N-1}] \text{ and } D \in [0, 2^N-1].$$

Using the above definition for k, the compensation current can be expressed as:

$$Icomp(D=2^{N-1} \mp k)=k^2 \cdot I_{LSB}.$$

Based on Fermat's polygonal number theorem, $k^2$ can be expressed as a sum of the first k odd positive integers. Therefore, $$Icomp(D=2^{N-1} \mp k)=[1+3+5+ \ldots +(2k-3)+(2k-1)] \cdot I_{LSB}, \text{ or}$$

$$Icomp(D = 2^{N-1} \mp k) = I_{LSB} \cdot \sum_{j=1}^{k} (2j-1).$$

The compensation current at code D=$2^{N-1} \mp k$ is thus the sum of the first k odd positive integers multiples of the current $I_{LSB}$. By generating the compensation current, the total current consumption of the system 100 can be maintained to be substantially constant. For example, the linearity of the DAC 102 can be improved. Some example compensation circuits for generating such code-dependent compensation current are described below.

Example Compensation Circuit with WRN

Figure 3:
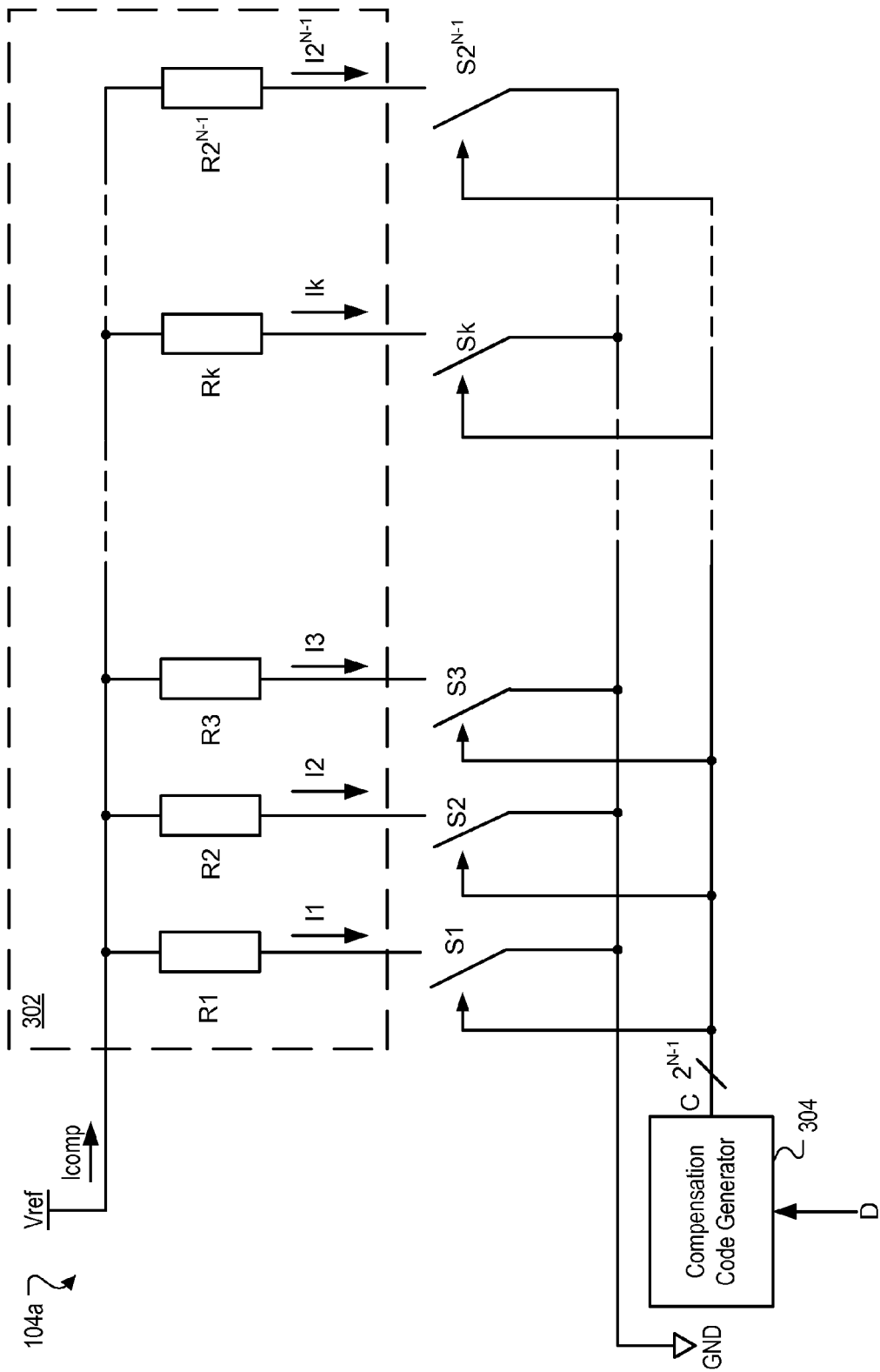
FIGS. 3-4 are schematic diagrams illustrating example compensation circuits.

FIG. 3 is a schematic diagram illustrating an example compensation circuit 104a that includes a weighted resistive network (WRN) 302. In one implementation, the compensation circuit 104a can be used as the compensation circuit 104 in the system 100. The compensation circuit 104a receives the digital input D. For example, the digital input D is identical to the digital input received by the DAC 102. Based on the digital input D, the compensation circuit 104a can generate a compensation current Icomp to substantially mitigate the variation of the current consumption of the DAC 102 (Iref) due to different digital inputs.

The WRN 302 includes a set of resistive elements. In particular, WRN 302 includes $2^{N-1}$ parallel connected resistors R1, R2, ..., R$2^{N-1}$. For example, N is the number of bits of the received digital input D. In some implementations, the resistance of a resistor Rk can be computed by $$Rk = \frac{2^N \cdot R}{2k-1}.$$

For example, the resistance of R1 is $2^N \cdot R$, the resistance of R2 is $$\frac{2^N \cdot R}{3},$$

etc.

As shown, the parallel resistors R1, R2, ..., R$2^{N-1}$ are connected to ground GND through switches S1, S2, ... S$2^{N-1}$, respectively. After the switch Sk is closed, the resistor Rk is connected to GND. In this example, if the switch Sk is closed, a current Ik flows from Vref to GND. The current Ik can be expressed as:

$$Ik = (2k-1) \cdot I_{LSB} = (2k-1) \frac{LSB}{R}.$$

The switches S1-S$2^{N-1}$ are controlled by a $2^{N-1}$-bits control word generated by a compensation code generator 304. In one implementation, the compensation code generator 304 generates the compensation code C based on the digital input D. In one implementation, the compensation code generator 304 is configured to generate an intermediate code based on a most significant bit (MSB) of D. In one example, if the MSB of D is 0, then the compensation code generator 304 is configured to generate the intermediate code by determining two's complement of the remaining least significant bits (LSBs) of D. Conversely, if the MSB of D is 1, then the compensation code generator 304 is configured to generate the intermediate code based on the remaining LSBs of D. Next, the compensation code generator 304 generates C by converting the intermediate code to a thermometer code.

In this example, C includes $2^{N-1}$ data bits. For example, if the intermediate code represents a binary value of b, b of the LSB of the compensation code C is at logic 1, and the rest of the compensation code C is at logic 0. In one example, suppose the intermediate code is "101," representing a binary value of 5. Then, the compensation code generator 304 can generate a thermometer code "0000 0001 1111" as the compensation code C. The switches S1 to S$2^{N-1}$ can then use the generated code C to determine whether each of the resistors R1-R$2^{N-1}$ is to be connected to GND. For example, if the compensation code C is "0000 0001 1111," then the switches S1-S5 are closed, causing the resistors R1-R5 to be connected to GND. Thus, the currents I1-I5 are flowing through the resistors R1-R5 to GND. As a result, the compensation circuit 104a generates Icomp that balances the current consumption of the DAC 102 to be:

$$Icomp = I1 + I2 + I3 + I5 = I_{LSB} \cdot \sum_{j=1}^{5} (2j-1).$$

As an illustrative example, suppose N=3 and D=010. The current consumption at the DAC 102 is:

$$Iref(2) = 2 \cdot (2^3 - 2) \cdot \frac{LSB}{R} = 12 \cdot \frac{LSB}{R}.$$

To generate the compensation current, the compensation code generator 304 determines to use the two's complement of the LSBs of D, "10," because the MSB of D is 0. Next, the compensation code generator 304 generates the two's complement of LSBs of D, which is "10" in this case, to a thermometer code "0011." As a result, the switches S1 and S2 are closed, and the other switches S3 and S4 are opened. In some examples, the current generated by closing S1 and S2 is:

$$Icomp(D=2) = I1 + I2 = \frac{LSB}{R} + 3 \cdot \frac{LSB}{R} = 4 \cdot \frac{LSB}{R}.$$

The compensation current Icomp(D=2) can substantially mitigate the current consumption variance generated by the input code D=010 at the DAC 102.

In another example, suppose N=3 and D=101. The current consumption at the DAC 102 is:

$$Iref(5) = 5 \cdot (2^3 - 5) \cdot \frac{LSB}{R} = 15 \cdot \frac{LSB}{R}.$$

In this case, the compensation code generator 304 determines to use the LSBs of D, "01," because the MSB of D is 1. Next, the compensation code generator 304 converts the remaining LSBs of D, which is "01" in this case, to a thermometer code "0001." As a result, the switch S1 is closed, and the other switches S2, S3 and S4 are opened. In some examples, the current generated by closing S1 and S2 is:

$$Icomp(D=5) = I1 = \frac{LSB}{R}.$$

The current Icomp(D=5) can substantially mitigate the current consumption variance generated by the input code D=101 at the DAC 102. For example, the total current consumption of the system 100 including the DAC 102 and the current compensation circuit 104a can be maintained at:

$$Isrc = Iref(D=5) + Icomp(D=5) = 15 \cdot \frac{LSB}{R} + \frac{LSB}{R} = 16 \cdot \frac{LSB}{R} = I_{max}.$$

Although one implementation of the compensation circuit 104 is described, other implementations are also possible. For example, transistors (e.g., metal-oxide-semiconductor field-effect transistor (MOSFET)) can be used to generate the compensation currents I1-I2$^{N-1}$.

Example Compensation Circuit with Weighted Current Mirror Network

Figure 4:
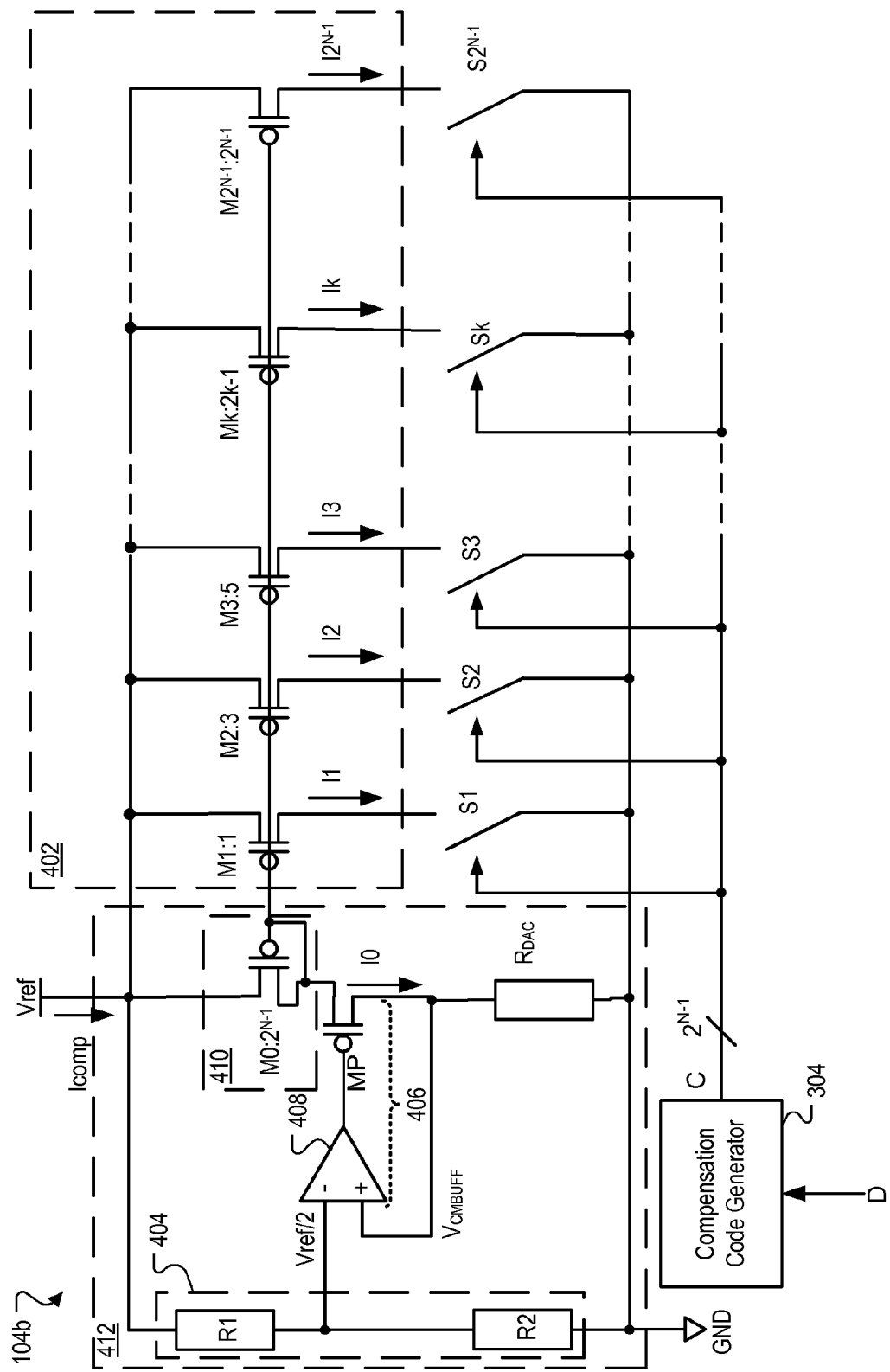

FIG. 4 is a schematic diagram illustrating an example compensation circuit 104b that includes a weighted current mirror network 402 and a compensation subcircuit 412. For example, the compensation circuit 104b can generate a compensation current based on a digital input D to maintain the total current consumption Isrc of the system 100.

The weighted current mirror network 402 includes a set of resistive elements. In particular, the weighted current mirror network 402 includes $2^{N-1}$ transistors M1-M2$^{N-1}$. As shown in FIG. 4, each of the transistors M1-M2$^{N-1}$ has a notation to indicate a number of instances of unit p-type MOSFET (PMOS) in each of the transistors M1-M2$^{N-1}$. For example, the transistor M1 has a notation of M1:1, meaning the transistor M1 includes one instance of a unit PMOS. In another example, transistor M3 has a notation of M3:5, meaning the transistor M3 includes five instances of a unit PMOS in parallel. In general, each transistor Mk is made up with $[k^2-(k-1)^2]=(2k-1)$ identical instances of unit PMOS.

Each of the transistors M1-M2$^{N-1}$ can be coupled to one of the corresponding switches S1-S2$^{N-1}$. In this example, the switches S1-S2$^{N-1}$ are controlled by a compensation code C generated from the compensation code generator 304. The operations of the switches S1-S2$^{N-1}$ and the compensation code generator 304 are described with reference to FIG. 3.

The compensation subcircuit 412 includes a resistive divider 404. In some implementations, the resistive divider 404 includes two resistors R1 and R2. The resistance of R1 and R2 can be substantially the same to generate a divided voltage $$\frac{Vref}{2}.$$

The compensation subcircuit 412 also includes a voltage follower 406 operable to buffer the divided voltage $$\frac{Vref}{2}.$$

In the example shown, the voltage follower 406 includes an amplifier 408 and a PMOS MP. The voltage follower 406 is connected to the resistive divider 404 through a negative terminal of the amplifier 408 and to a resistor $R_{DAC}$ at a node connecting the positive terminal of the amplifier 408 and a terminal of MP. The voltage follower 406 generates a voltage $V_{CMBUFF}$ at the top of a resistor $R_{DAC}$. In one implementation, $R_{DAC}$ may be substantially identical to the resistors R used in the DAC 102 as described in reference to FIG. 2. For example, $R_{DAC}$ can be produced by matching the resistance R in the DAC 102.

The voltage follower 406 is also connected to a diode 410 via another terminal of MP. In this example, the diode 410 includes a PMOS M0. Using the notation M0:$2^{N-1}$, M0 is made up with $2^{N-1}$ identical instances of a unit PMOS placed in parallel. Thus, the current density in each instance of M0 is:

$$I_{LSB} = \frac{V_{REF}}{2^N \cdot R} = \frac{LSB}{R}.$$

Using the current mirror network 402, the current flowing through M0 is copied at the transistors M1 to M2$^{N-1}$ in the current mirror network 402. As described above, the current flowing from each instance of unit PMOS is $$I_{LSB} = \frac{V_{REF}}{2^N \cdot R} = \frac{LSB}{R}.$$

After the switch Sk is closed, the current available from Mk is:

$$Ik = (2k-1) \cdot I_{LSB} = (2k-1) \cdot \frac{LSB}{R}.$$

Using the described example, in which N=3 and D=010, the compensation code generator 304 generates the compensation code C such that the switches S1 and S2 are closed, and the other switches S3 and S4 are opened. As such, the compensation circuit 104b can generate a compensation current $$Icomp(D=2) = I1 + I2 = \frac{LSB}{R} + 3 \cdot \frac{LSB}{R} = 4 \cdot \frac{LSB}{R}.$$

As described with reference to FIG. 3, when D=010, the current consumption at the DAC 102 is:

$$Iref(2) = 2 \cdot (2^3 - 2) \cdot \frac{LSB}{R} = 12 \cdot \frac{LSB}{R}.$$

Because $$Iref(D=2) + Icomp(D=2) = 12 \cdot \frac{LSB}{R} + 4 \cdot \frac{LSB}{R} = 16 \cdot \frac{LSB}{R} = I_{max},$$

the compensation current Icomp(D=2) generated by the compensation circuit 104b can substantially mitigate the current consumption variance generated by the input code D=010 at the DAC 102.

Depending on the compensation code C, the compensation circuit 104b can generate the compensation current to substantially maintain the total current consumption, Isrc, of the system 100 at a maximum level. Therefore, the linearity of the DAC 102 can be preserved. In some implementations, the compensation circuit 104b can be implemented using less circuit area than the compensation circuit 104a because a reduced number of matched resistors (a single matched resistor R$_{DAC}$ in the compensation circuit 104b) is required to obtain the compensation current.

Although one implementation of the compensation circuit 104b is described, other implementations are also possible. For example, the diode 410 can include other types of resistive elements.

A number of implementations of the invention have been described. Nevertheless, it will be understood that various modifications may be made without departing from the spirit and scope of the invention. Accordingly, other implementations are within the scope of the following claims.

What is claimed is:

1. A circuit, comprising:
    a weighted resistive network including a first set of resistive elements;
    a switch network coupled to the weighted resistive network and operable to select one or more resistive elements from the first set of resistive elements in response to an input signal; and
    a digital-to-analog converter (DAC) subcircuit coupled to the weighted resistive network,
    wherein the circuit is operable to generate a code dependent compensation current from the input signal that balances a code dependent current consumption from a reference voltage of the first set of resistive elements, such that a sum of the code dependent compensation current and the code dependent current consumption from the reference voltage is substantially independent of the code and substantially equal to a maximum current consumption from the reference voltage of the first set of resistive elements before compensation.

2. The circuit of claim 1, wherein the DAC subcircuit is an N-bit digital-to-analog converter including $2^N$ resistive elements R coupled to a switch network, the switch network coupled to a reference voltage V$_{REF}$.

3. The circuit of claim 2, wherein the code dependent compensation current at a digital code $$D = 2^{N-1} \mp k \text{ is } \left[\frac{V_{REF}}{(2^N \cdot R)}\right] \cdot \sum_{j=1}^{k} (2j-1),$$

where k is the distance from D to mid-scale.

4. The circuit of claim 3, wherein each resistive element in the weighted resistive network is made up of weight $$\frac{2^N \cdot R}{2k-1}.$$

5. The circuit of claim 1, further comprising:
    a compensation signal generator coupled to the switch network and operable to generate the input signal from a binary code, wherein
    a most significant bit of the binary code is one, and the input signal comprises remaining least significant bits of the binary code; or
    the most significant bit of the binary code is zero, and the input signal is a bit to bit complement of the remaining least significant bits of the binary code.

6. The circuit of claim 2, wherein the weighted resistive network is a weighted current mirror network and the circuit further includes:
    a compensation subcircuit coupled to the weighted current mirror network including:
        a resistive divider coupled to the reference voltage of the first set of resistive elements and operable to generate a divided voltage,
        a voltage follower coupled to the resistive divider and operable to buffer the divided voltage,
        a resistive element coupled to the voltage follower, wherein the resistive element is matched to the DAC subcircuit, and
        a second set of resistive elements coupled to the voltage follower.

7. The circuit of claim 6, wherein the resistive element of the compensation subcircuit is of substantially same value as R.

8. The circuit of claim 6, wherein the second set of resistive elements is one or more diodes.

9. The circuit of claim 8, wherein the second set of resistive elements consists of $2^{N-1}$ resistive elements.

10. The circuit of claim 9, wherein the $2^{N-1}$ resistive elements include transistors.

11. The circuit of claim 6, wherein the voltage follower includes an amplifier coupled to a transistor.

12. A system comprising:
a digital-to-analog converter (DAC) having a native code dependent current consumption; and
a compensation circuit coupled to the DAC and operable for configuring a number of resistive elements to generate a code dependent current consumption for balancing the native code dependent current consumption to provide a code independent current consumption within the DAC that is substantially equal to a maximum current consumption within the DAC.

13. The system of claim 12, wherein the compensation circuit comprises:
a resistive divider coupled to a reference voltage and operable to generate a divided voltage; and
a voltage follower coupled to the resistive divider and operable to buffer the divided voltage.

14. The system of claim 13, wherein the DAC is an N-bit digital-to-analog converter including $2^N$ resistive elements R coupled to a switch network, the switch network coupled to a reference voltage $V_{REF}$.

15. The system of claim 14, wherein the compensation circuit further comprises:
a resistive element coupled to the voltage follower and the DAC, where the resistive element is of substantially same value as R.

16. The system of claim 14, wherein the code dependent compensation current at a digital code $$D = 2^{N-1} \mp k \text{ is } \left[\frac{V_{REF}}{(2^N \cdot R)}\right] \cdot \sum_{j=1}^{k} (2j-1),$$

where k is the distance from D to mid-scale.

17. The system of claim 12, wherein the number of resistive elements includes one or more diodes.

18. The system of claim 17, wherein the number of resistive elements consists of a set of $2^{N-1}$ resistive elements.

19. The system of claim 18, wherein the set of $2^{N-1}$ resistive elements includes transistors.

20. The system of claim 12, further comprising:
a compensation signal generator coupled to the compensation circuit and operable to generate an input signal from a binary code, wherein
a most significant bit of the binary code is one, and the input signal comprises remaining least significant bits of the binary code; or
the most significant bit of the binary code is zero, and the input signal is a bit to bit complement of the remaining least significant bits of the binary code.

21. The system of claim 13, wherein the voltage follower includes an amplifier coupled to a transistor.

* * * * *

UNITED STATES PATENT AND TRADEMARK OFFICE
CERTIFICATE OF CORRECTION

PATENT NO. : 7,564,385 B2
APPLICATION NO. : 11/959379
DATED : July 21, 2009
INVENTOR(S) : Thierry Soude et al.

Page 1 of 1

It is certified that error appears in the above-identified patent and that said Letters Patent is hereby corrected as shown below:

Column 4, Line 45; replace:
"At mid-scale $2^N-1$, Iref rises to the maximum. The maxi-" with
-- At mid-scale $2^{N-1}$, Iref rises to the maximum. The maxi- --

Column 5, Lines 7-9; replace the current formula, with:

$$Isrc = 2^{N-2} \cdot \frac{Vref}{R} = 2^{2N-2} \cdot \frac{LSB}{R}, \text{ or } Isrc = 2^{2N-2} \cdot I_{LSB},$$

Column 5, Line 31; replace the current formulas, with:

$$D = 2^{N-1} \mp k \text{ with } k \in [0, 2^{N-1}] \text{ and } D \in [0, 2^N - 1].$$

Column 7, Line 5; replace the current formula, with:

$$Icomp = I1 + I2 + I3 + I4 + I5 = I_{LSB} \cdot \sum_{j=1}^{5}(2j-1).$$

Signed and Sealed this

Thirteenth Day of October, 2009

David J. Kappos
*Director of the United States Patent and Trademark Office*